(12) United States Patent
Flagello

(10) Patent No.: US 8,910,093 B2
(45) Date of Patent: Dec. 9, 2014

(54) FAST PHOTORESIST MODEL

(75) Inventor: Donis G. Flagello, Scottsdale, AZ (US)

(73) Assignee: Nikon Corporation (JP)

( * ) Notice: Subject to any disclaimer, the term of this patent is extended or adjusted under 35 U.S.C. 154(b) by 0 days.

(21) Appl. No.: 13/200,668

(22) Filed: Sep. 28, 2011

(65) Prior Publication Data

US 2012/0079436 A1    Mar. 29, 2012

Related U.S. Application Data

(60) Provisional application No. 61/404,225, filed on Sep. 29, 2010.

(51) Int. Cl.
    *G06F 17/50*     (2006.01)
    *G03F 7/20*     (2006.01)

(52) U.S. Cl.
    CPC ............ *G03F 7/70625* (2013.01); *G03F 7/705* (2013.01)
    USPC .................................. 716/55; 716/50; 716/51

(58) Field of Classification Search
    USPC ................................ 716/50–51, 55
    See application file for complete search history.

(56) References Cited

U.S. PATENT DOCUMENTS

| | | | | |
|---|---|---|---|---|
| 5,124,927 | A * | 6/1992 | Hopewell et al. | 700/121 |
| 6,376,149 | B1 * | 4/2002 | Grober et al. | 430/139 |
| 7,494,752 | B2 * | 2/2009 | Croffie | 430/30 |
| 7,743,357 | B2 * | 6/2010 | Huang et al. | 716/50 |
| 7,934,176 | B2 * | 4/2011 | Huang et al. | 716/54 |
| 8,161,424 | B2 * | 4/2012 | Fan | 716/53 |
| 8,200,468 | B2 * | 6/2012 | Ye et al. | 703/13 |
| 8,257,912 | B2 * | 9/2012 | Kwinten et al. | 430/325 |
| 2002/0042019 | A1 * | 4/2002 | Grober et al. | 430/270.1 |
| 2004/0233402 | A1 * | 11/2004 | Smith | 355/52 |
| 2005/0170264 | A1 * | 8/2005 | Hukuhara | 430/5 |
| 2005/0183056 | A1 * | 8/2005 | Mimotogi et al. | 716/19 |
| 2005/0219516 | A1 * | 10/2005 | Smith | 356/124 |
| 2006/0183039 | A1 * | 8/2006 | Croffie | 430/30 |
| 2010/0218160 | A1 * | 8/2010 | Huang et al. | 716/20 |

OTHER PUBLICATIONS

G. Mladenov, K., et al., Simulation of latent image formation for an ion beam projections lithography, 2001 Elsevier Science, B. V., Microelectronic Engineering 57-58 (2001) pp. 335-342.*

Mulders, T., et al., "New Stochastic post-exposure bake simulation method", 2005, J. Microlith., Microfab., Microsyst. 4(4) 043010 (Oct.-Dec. 2005, downloaded from http//nanolithography.spiedigitallibrary.org/ on Jan. 14, 2013 pp. 1-25.*

Barouch, eytan, et al., "A new calibration method for latent image fidelity", 2008, Proc. of SPIE vol. 7140 714012-1, pp. 1-9.*

Klostermann, U.K., et al., "Calibration of physical resist models: Methods, usability, and predictive power", 2009, Proc. of SPIE vol. 7273, 727342, pp. 1-12.*

(Continued)

Primary Examiner — Stacy Whitmore

(74) Attorney, Agent, or Firm — Yakov Sidorin; Quarles & Brady LLP

(57) ABSTRACT

A method of modeling an image intended to reside in a photoresist film on a substrate is provided. A simulated latent acid image of the image is produced, the simulated latent acid image is compressed in a predetermined direction, and developed to a pattern that enables (a) transfer of the pattern to the substrate or (b) further modeling of the pattern for transfer to the substrate.

24 Claims, 20 Drawing Sheets

(56) References Cited

OTHER PUBLICATIONS

Klostermann et al., (Citation of Abstract showing exact date of paper) "Calibration of physical resist modles: methods, usability, and predictive power". Sep. 18, 2009. SPIE, Journal of Micro/Nanolithography, MEMS, and MOEMS.*

Mack, Chris A., "Modeling Solvent Effects in Optical Lithography", University of Texas at Austin PhD Thesis, 1998, pp. 1-67.*

Mack, Chris A., "Using the normalized image log slope, part 4" The Lithography Expert. Nov. 2001. pp. 1-3.*

* cited by examiner

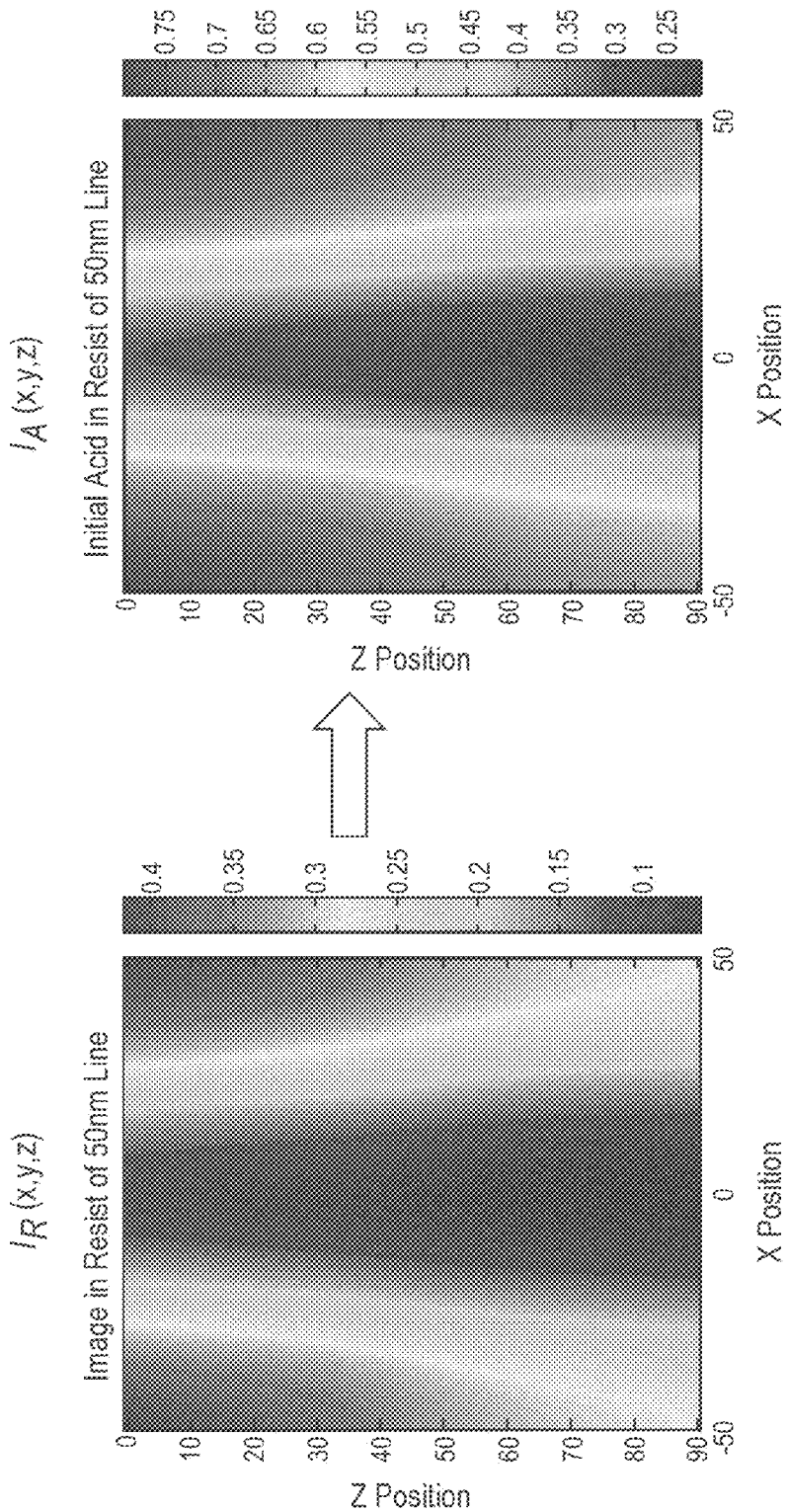

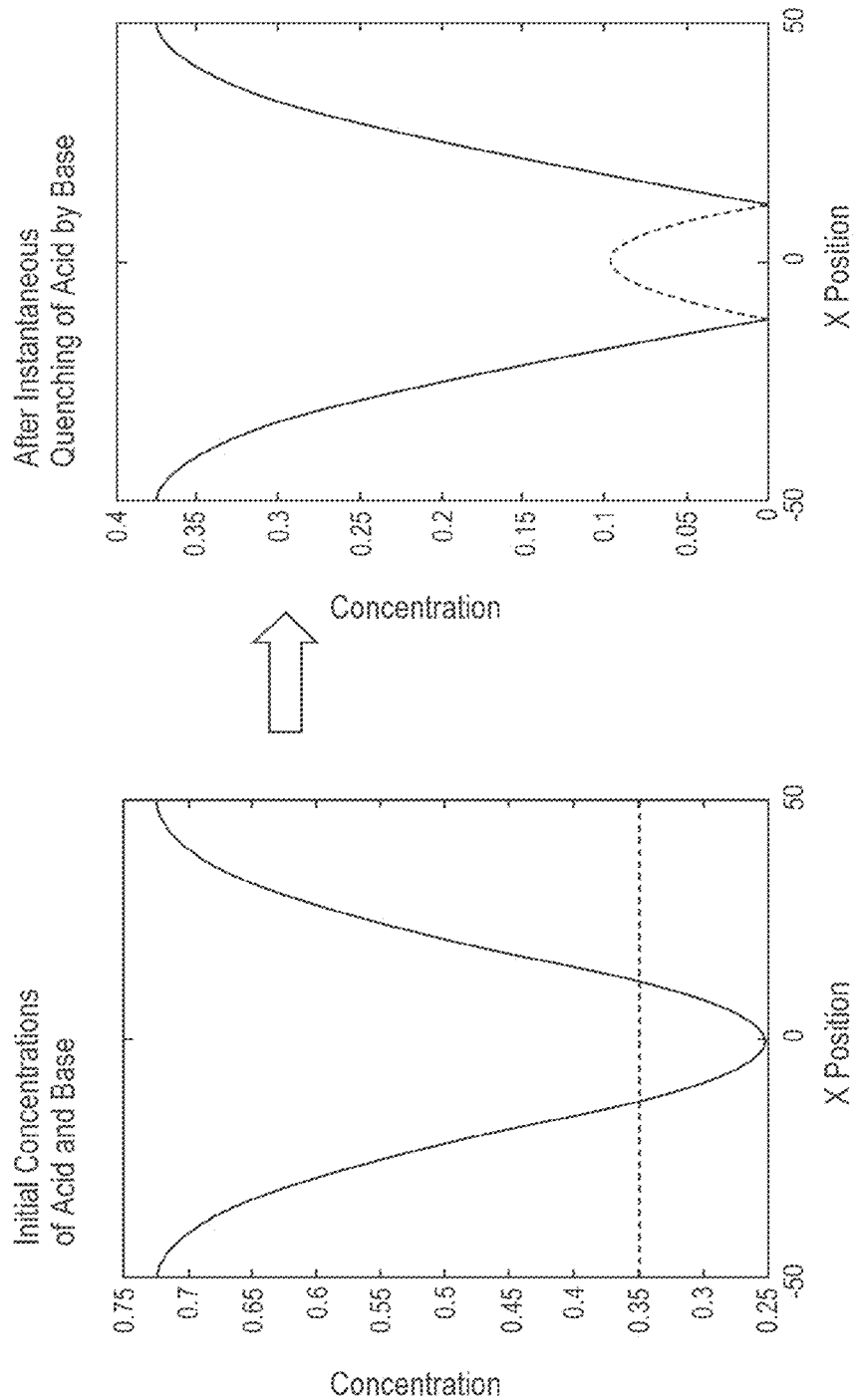

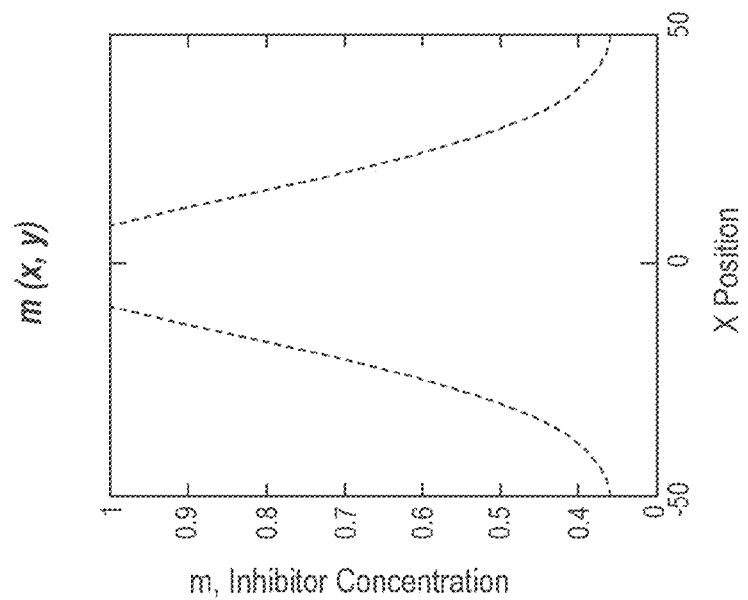
FIG. 8B
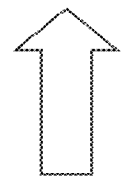
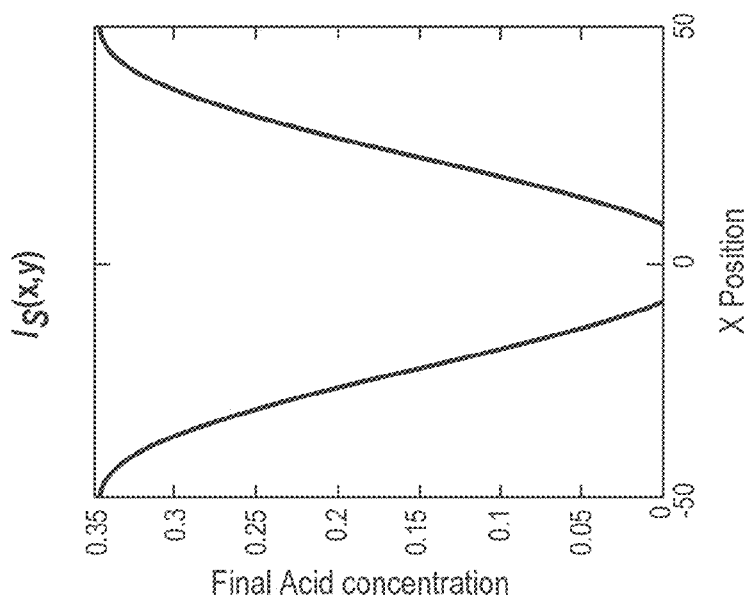
FIG. 8A

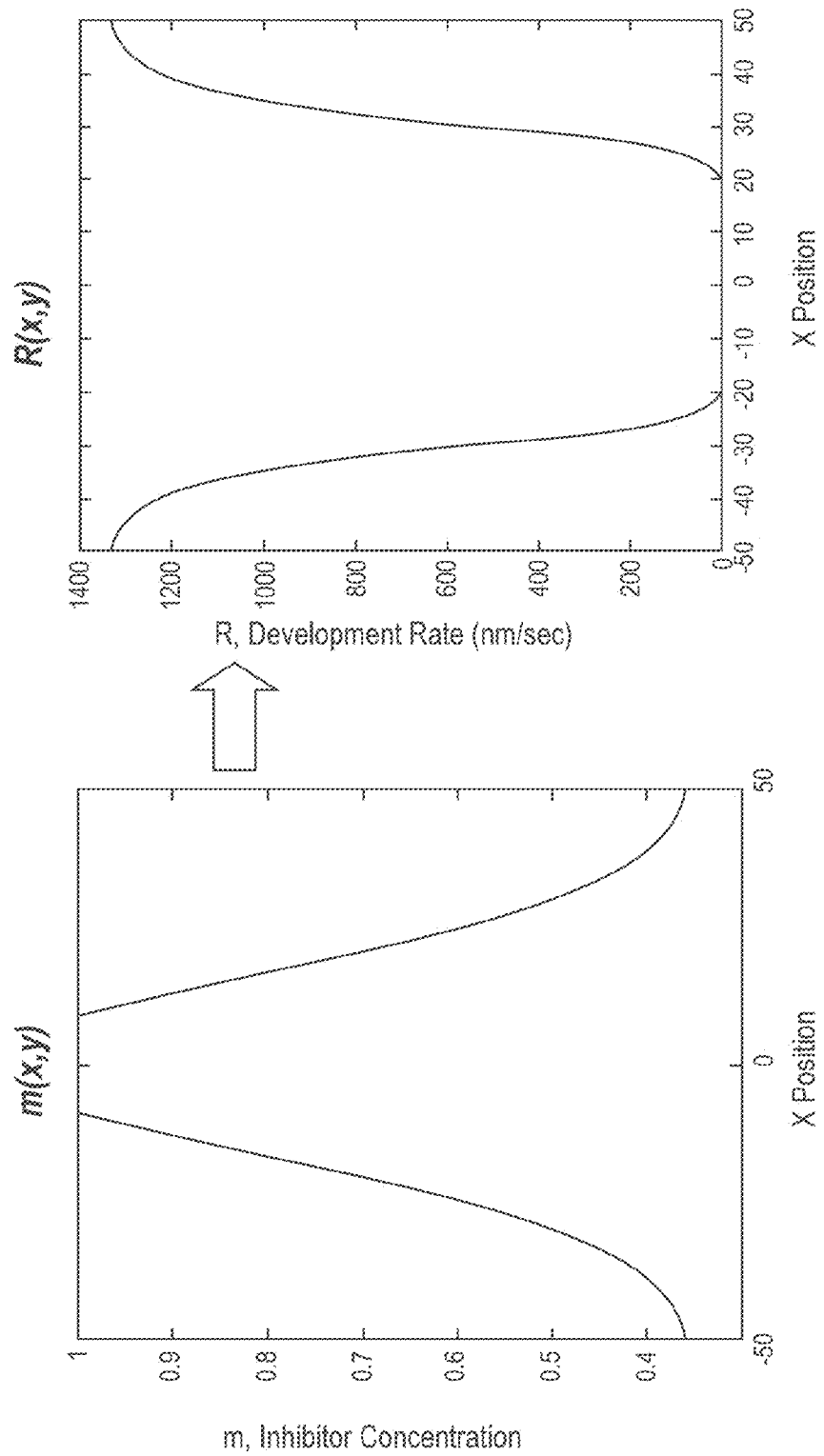

FAST PHOTORESIST MODEL

RELATED APPLICATION/CLAIM OF PRIORITY

This application is related to and claims priority from provisional application Ser. No. 61/404,225, filed Sep. 29, 2010, which provisional application is incorporated by reference herein.

INTRODUCTION AND SUMMARY OF THE PRESENT INVENTION

The invention relates to a method of modeling an image intended to reside in a photoresist film on a substrate.

The method of the present invention includes electronically compressing a simulated latent acid image in a predetermined direction in the production of a pattern that can be used either for transferring the pattern to a substrate (via a mask or reticle), or for further modeling the pattern for transfer to the substrate.

In its basic aspect, the method of the present invention comprises electronically producing a simulated latent acid image of the image, compressing the simulated latent acid image in a predetermined direction, and developing the simulated latent acid image to a pattern that enables (a) transfer of the pattern to the substrate or (b) further modeling of the pattern for transfer to the substrate In addition, the method preferably includes a sequence of steps where a development rate profile of the simulated latent acid image is produced, and then a final resist height is determined for the simulated latent acid image. Then, a critical dimension (CD) is determined from the final resist height, for the simulated latent acid image. Finally, a metrology offset is applied to the resist height, to complete development of the pattern. These aspects of the present invention are particularly useful where the image is a chemically amplified resist or an acid catalyzed resist, as will be apparent to those in the art.

In typical full resist models found in commercial software, the resist is electronically developed using small discreet time steps such that a development front is calculated in the x,y,z plane for each time step. This requires the computer to do extensive calculation and book keeping (thus requiring large amounts of CPU computational time and resources). The present invention produces the pattern by an electronic development rate profile that is not dependent on z, and thus significantly reduces the CPU computational time and resources to provide the modeling of the image.

Thus, a basic objective of the present invention is to create a modeling method that can operate faster than a full resist model but retains resist behavior development techniques such as quenching, post exposure bake, acid-base diffusion determination of inhibitor concentration.

Another basic object of the method of the present invention resides in compressing a simulated latent acid image in a predetermined direction (i.e. along the z direction or along the optical axis) in the production of the pattern.

Still another basic objective of the method of the present invention is to reduce computational time and resources to produce the pattern, while still replicating the results associated with a full photoresist model.

Further features of the present invention will be apparent from the following detailed description and the accompanying drawings and Exhibit.

BRIEF DESCRIPTION OF THE DRAWINGS AND EXHIBIT

Figure 1:
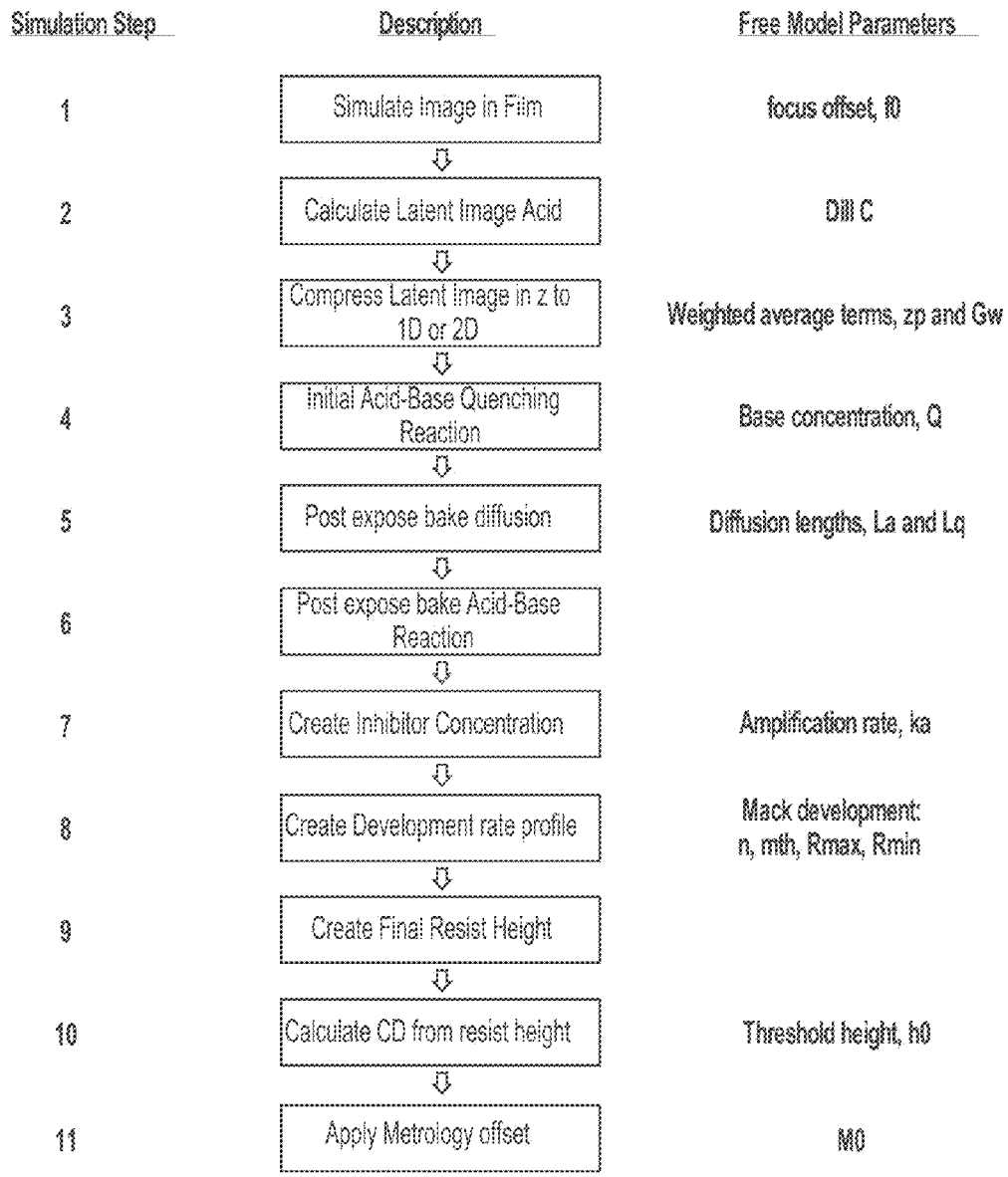
FIG. 1 is a flow-chart providing schematic illustration of the basic features of the method of the present invention.
Figures 4A, 4B:
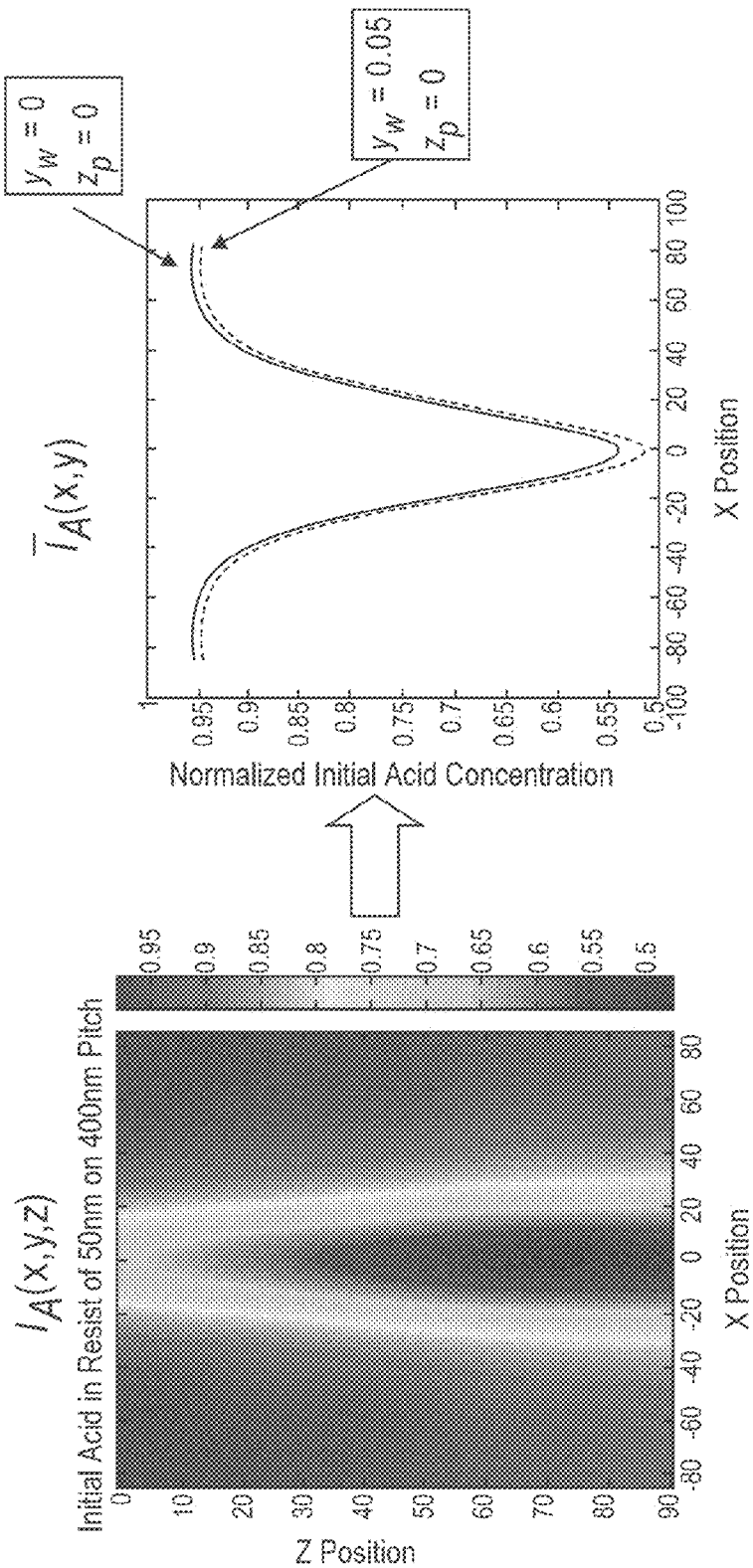
Figure 6:
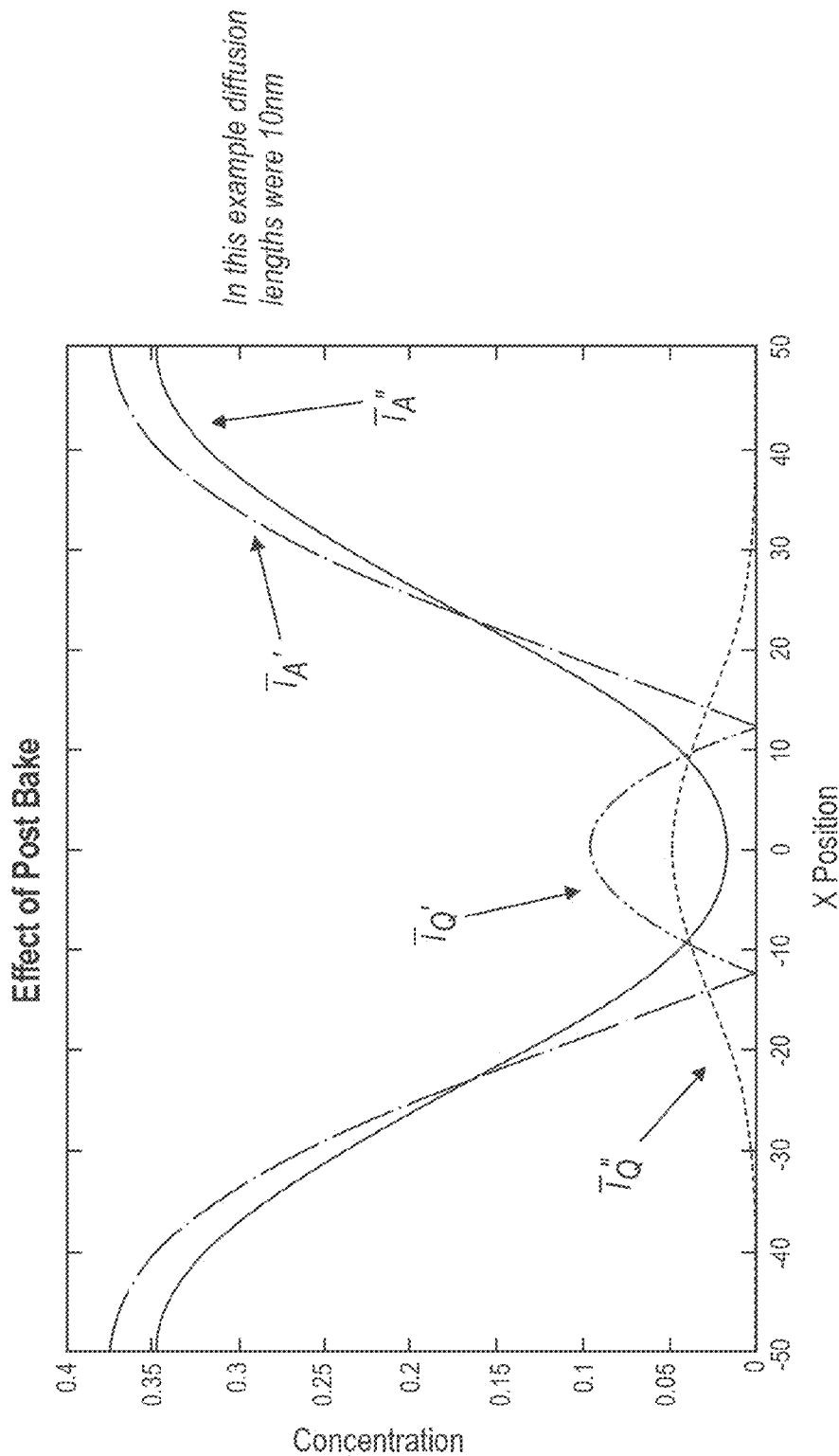
Figure 7:
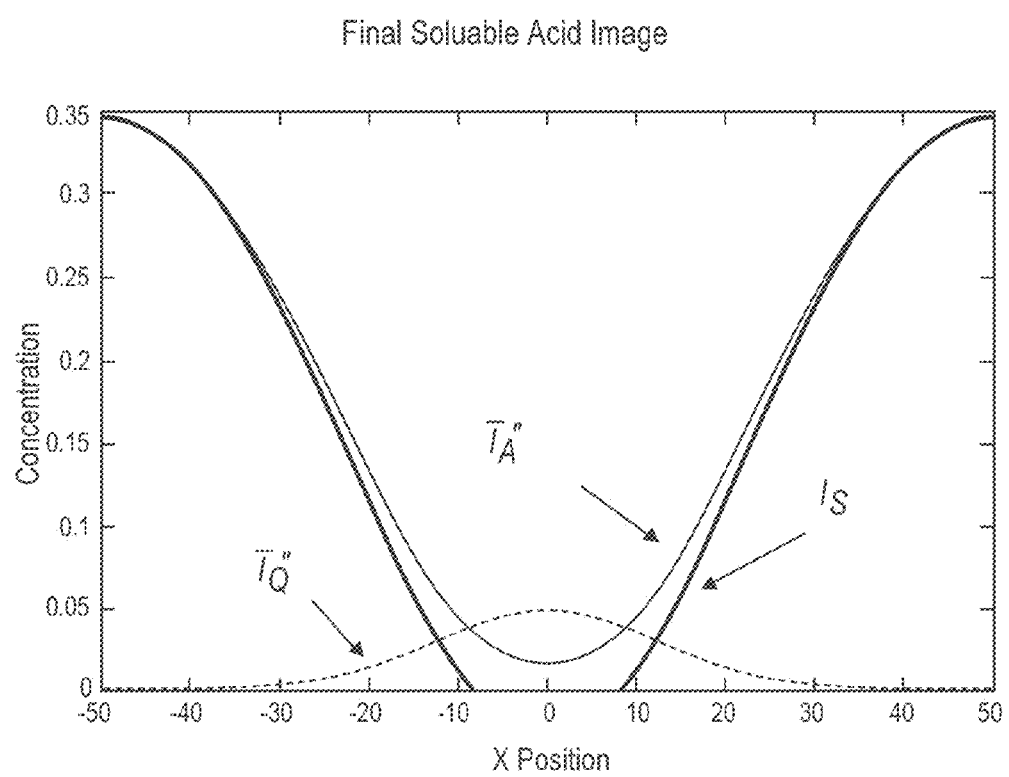
Figures 10A, 10B:
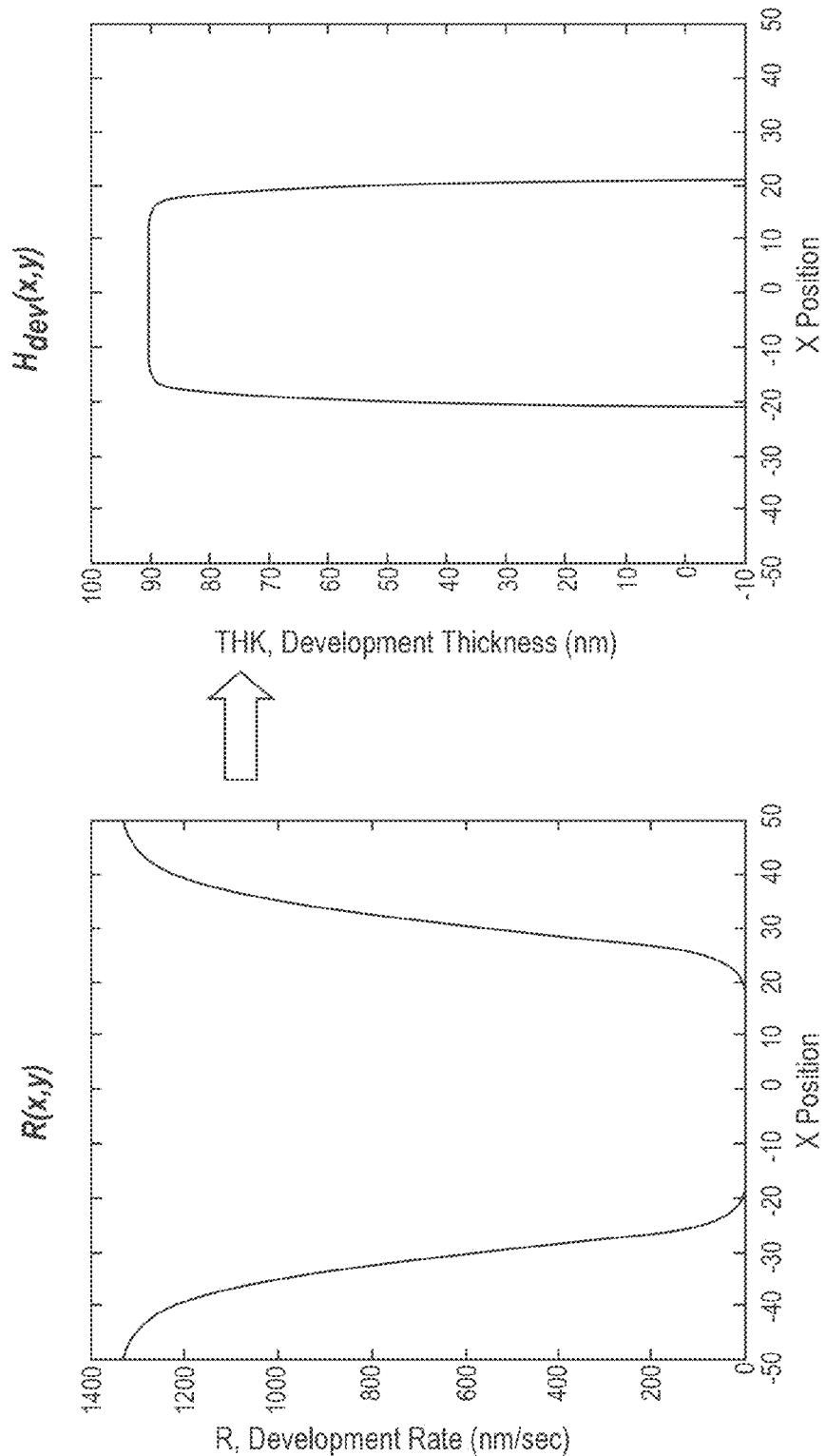
Figure 11:
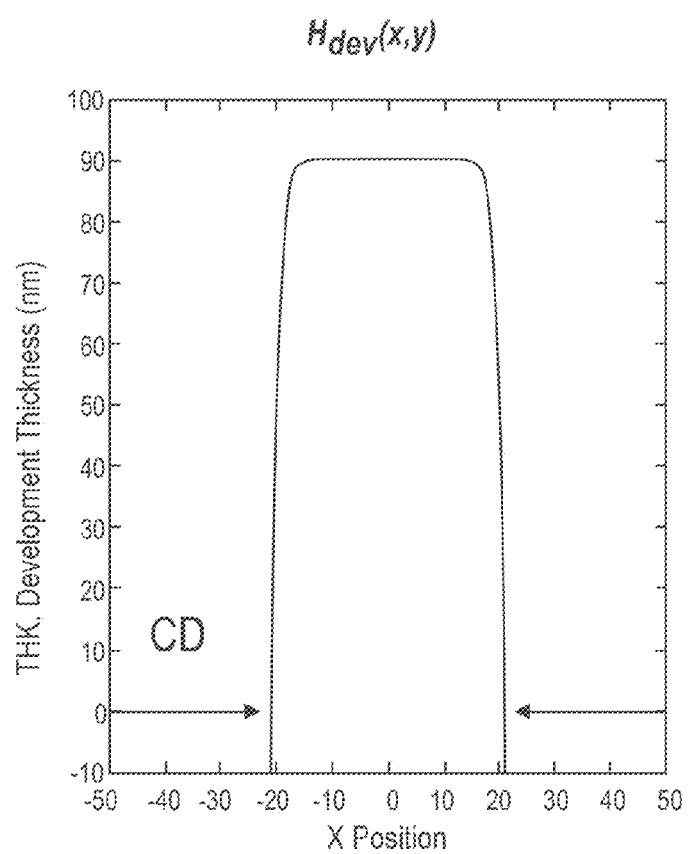
Figure 12:
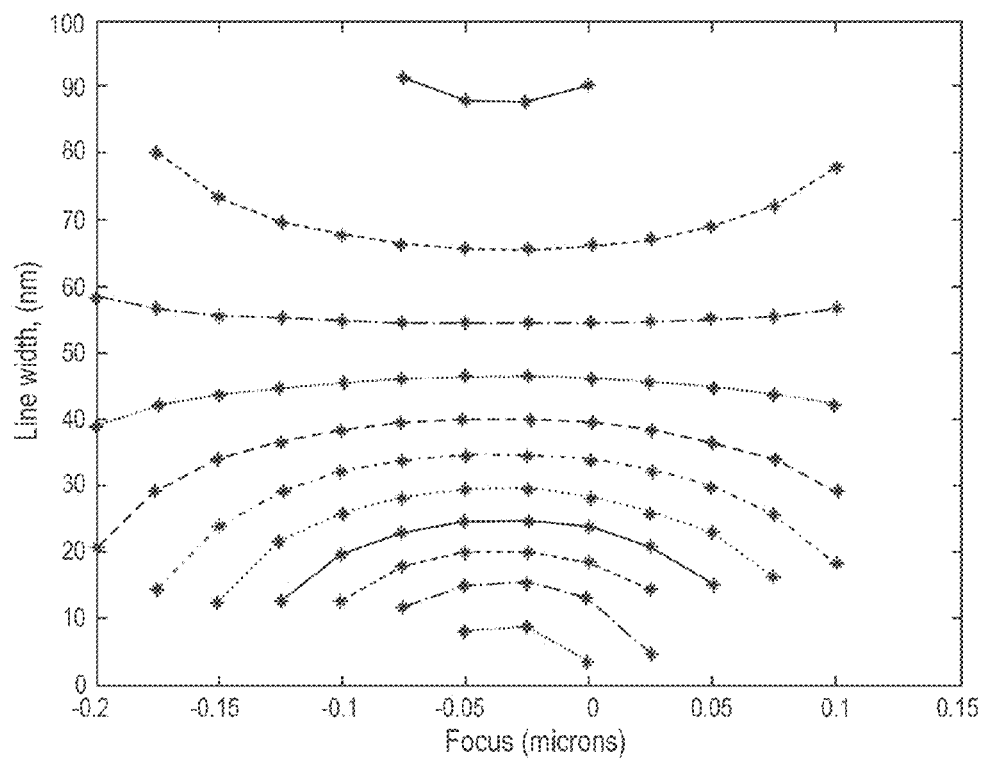
Figure 13:
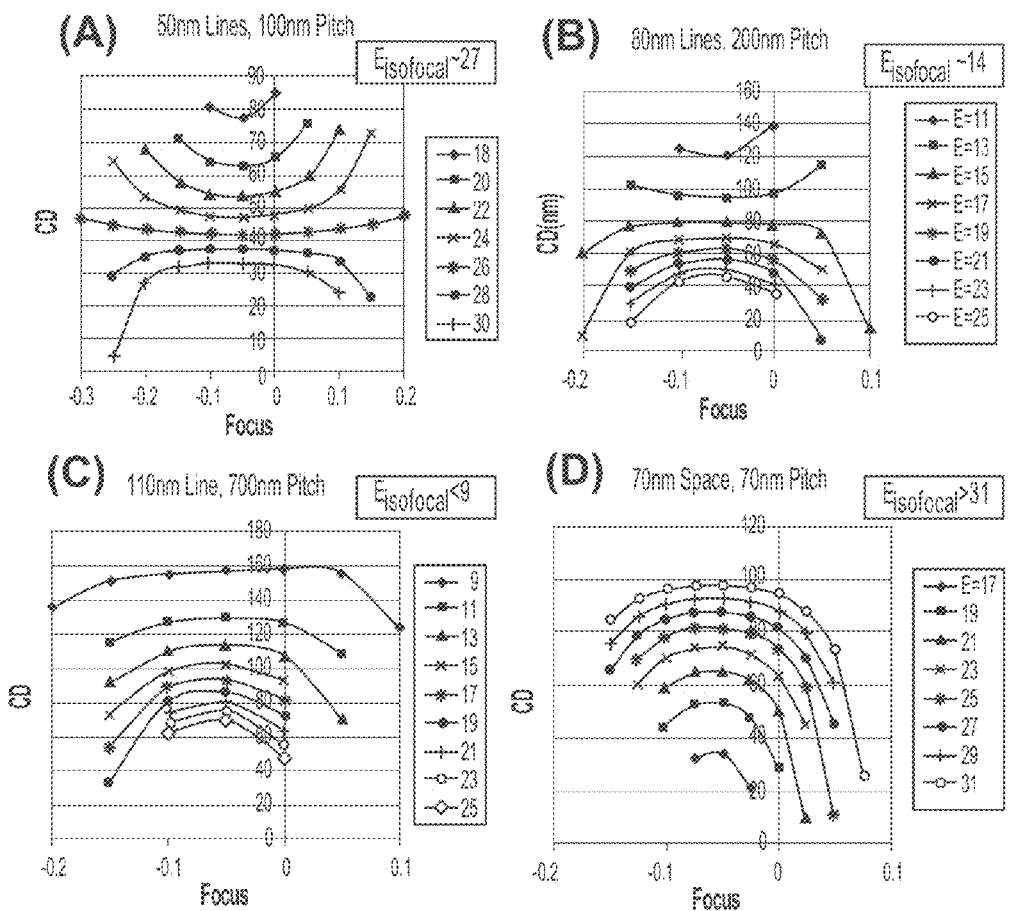
Figure 14:
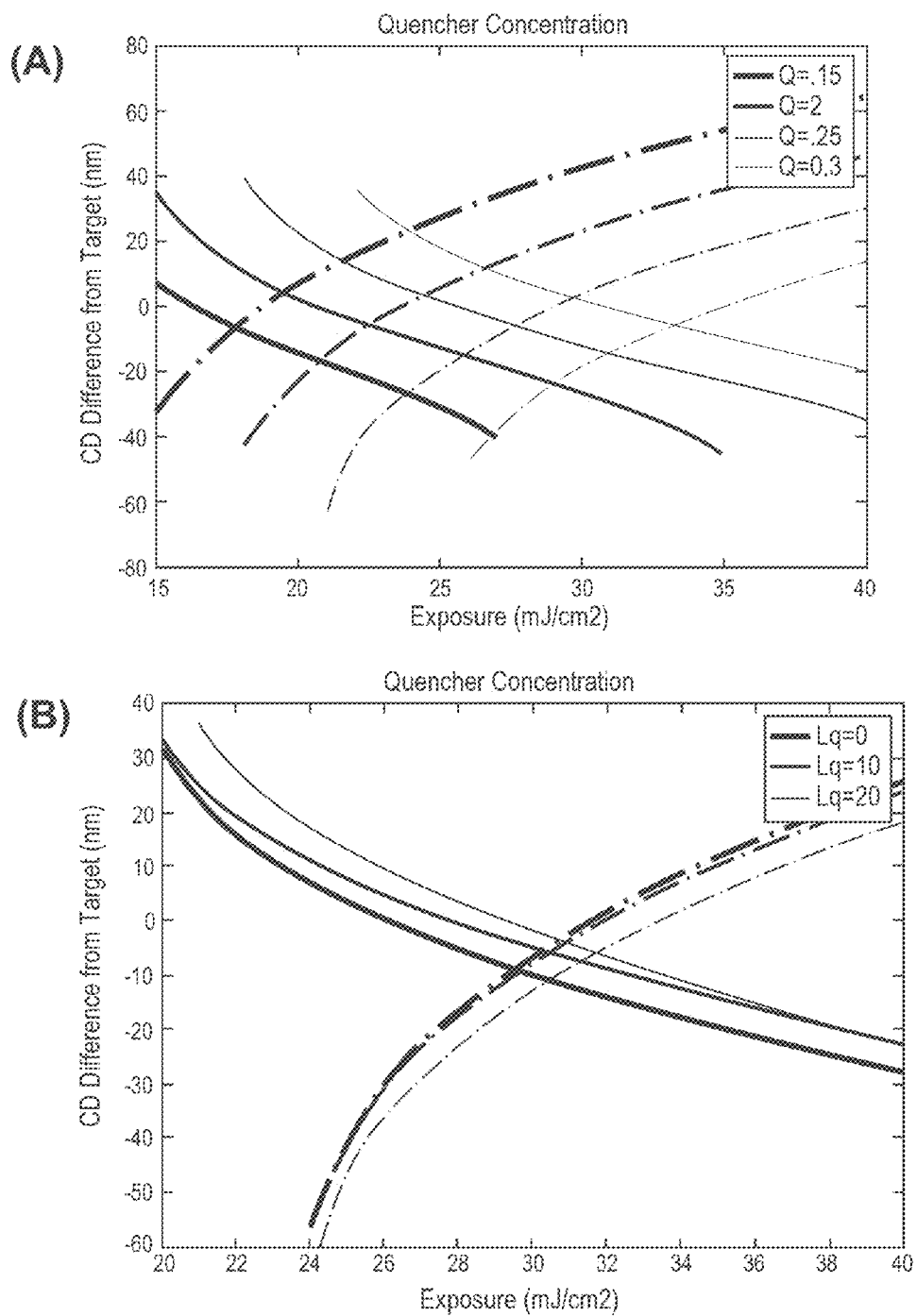
Figure 15:
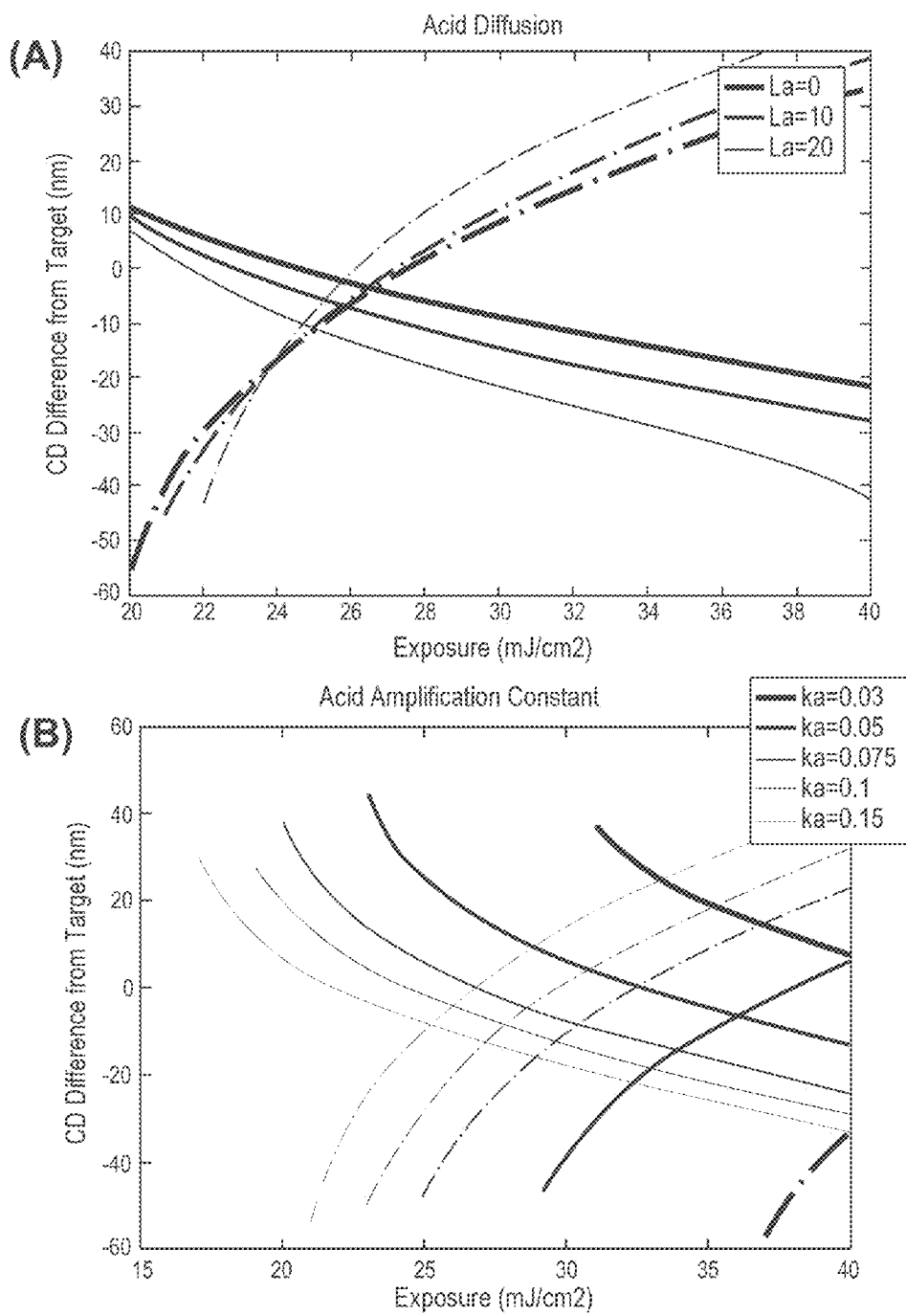
Figure 16:
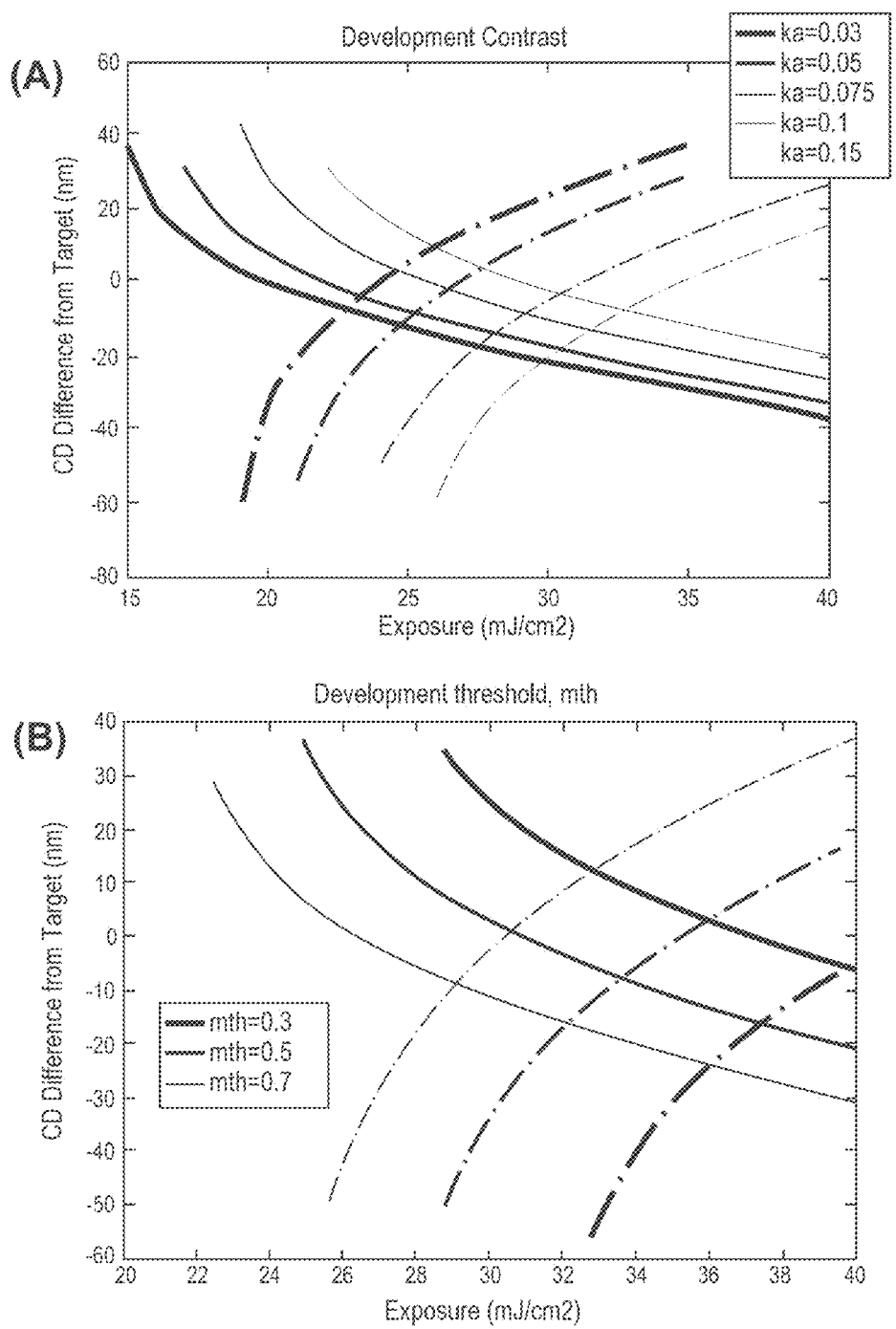
Figure 17:
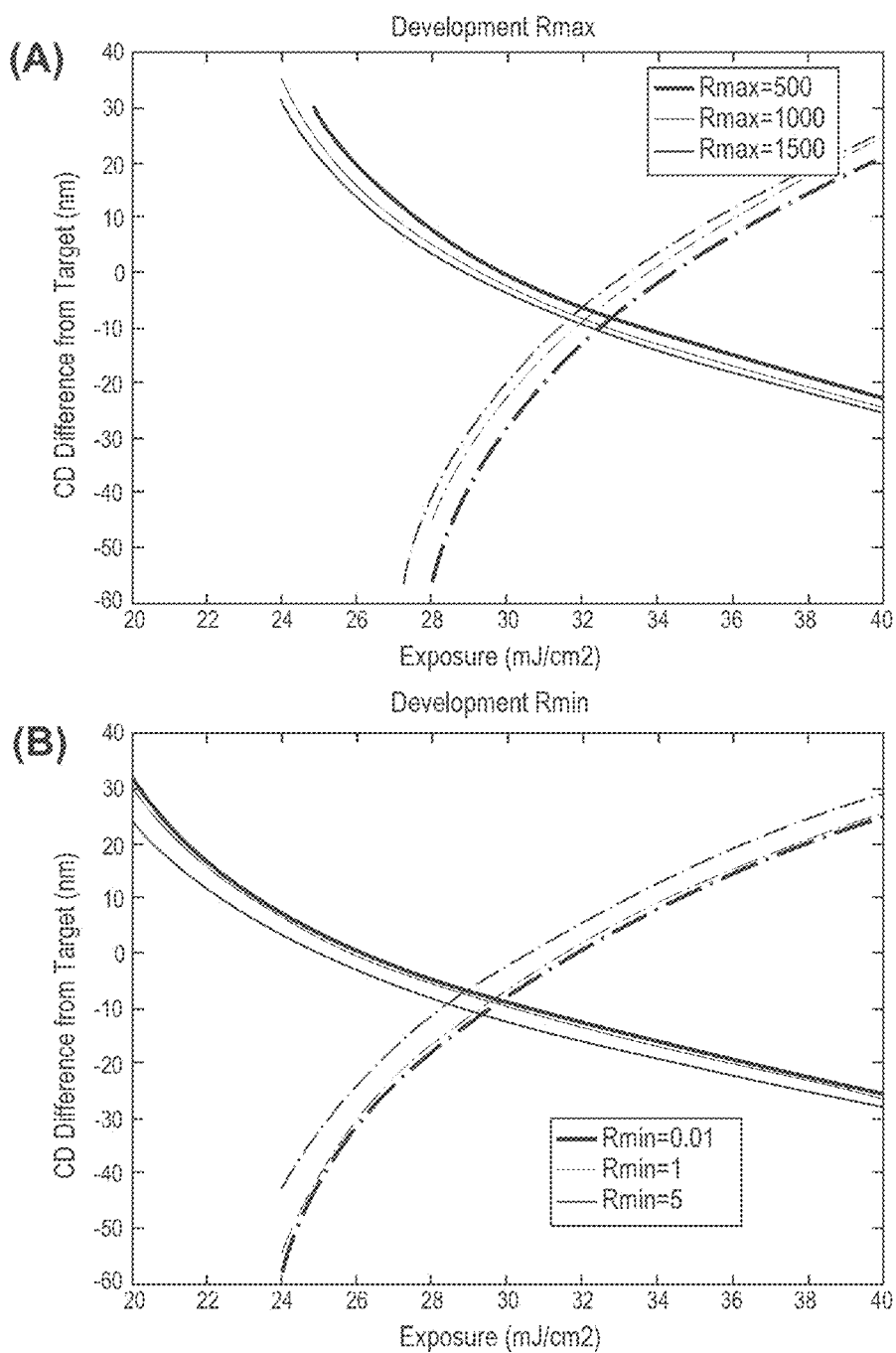
Figure 18:
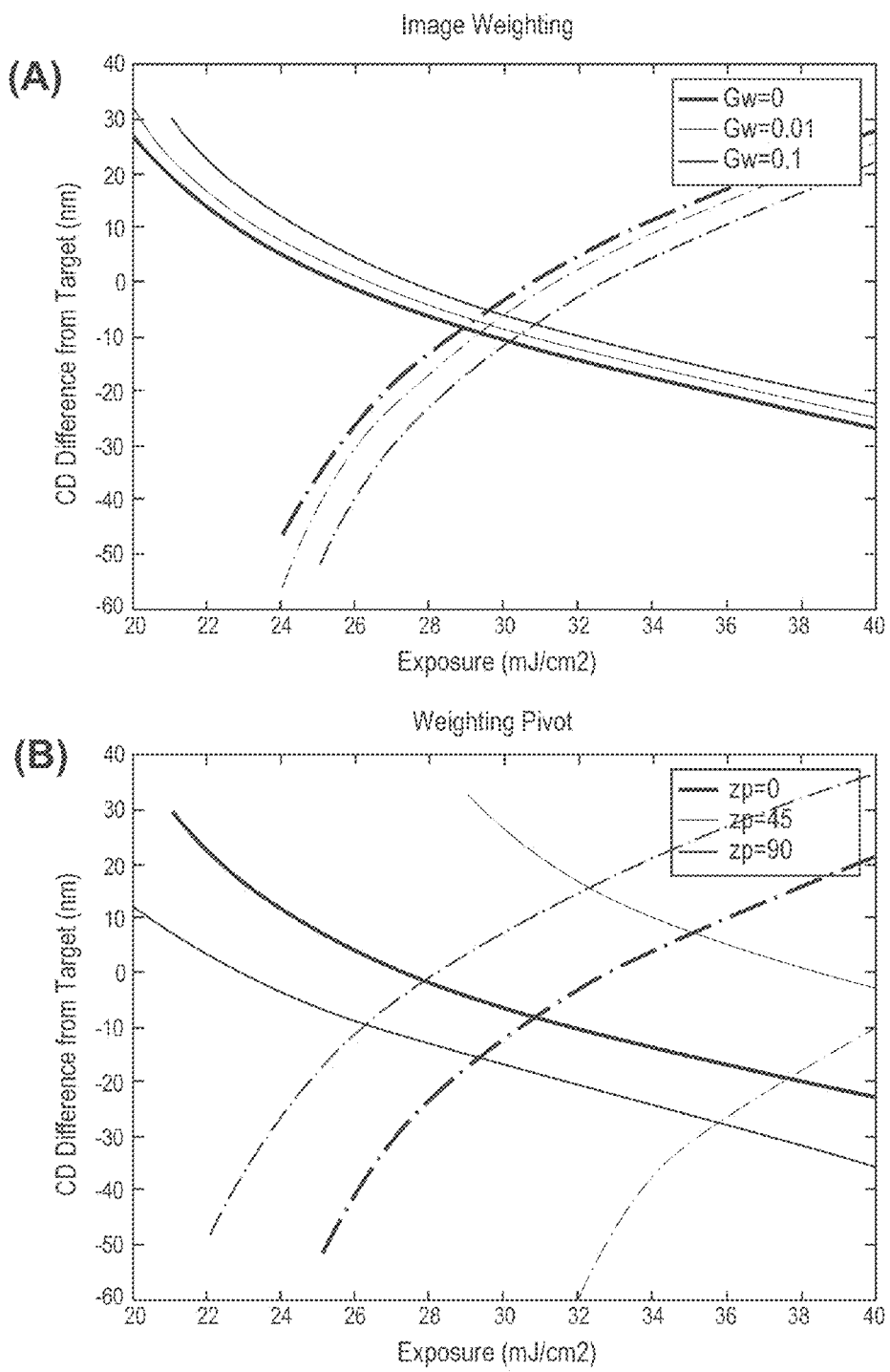
Figure 19:
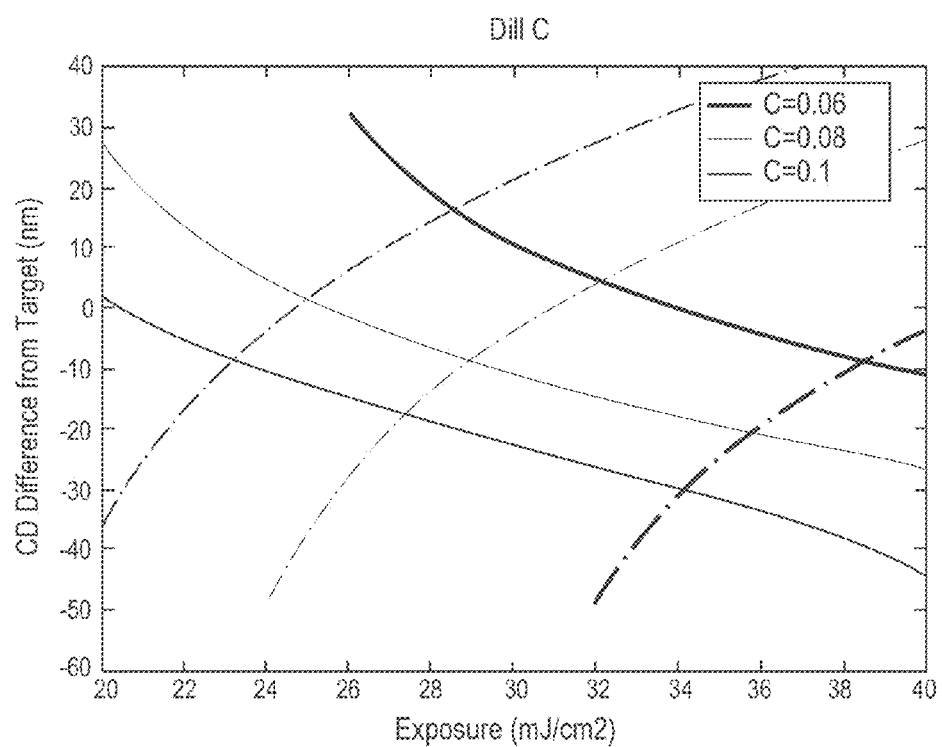

FIGS. 3A and 3B present images illustrating results of processing step 2 of a flow-chart of FIG. 1;

FIGS. 4A and 4B present an image and a plot, respectively, illustrating results of processing step 3 of a flow-chart of FIG. 1;

FIGS. 5A and 5B present plots illustrating results of processing step 4 of a flow-chart of FIG. 1;

FIG. 6 is a plot illustrating results of processing step 5 of a flow-chart of FIG. 1;

FIG. 7 is a plot illustrating results of processing step 6 of a flow-chart of FIG. 1;

FIGS. 8A and 8B present plots illustrating results of processing step 7 of a flow-chart of FIG. 1;

FIGS. 9A and 9B present plots illustrating results of processing step 8 of a flow-chart of FIG. 1;

FIGS. 10A and 10B present plots illustrating results of processing step 9 of a flow-chart of FIG. 1;

FIG. 11 is a plot illustrating results of processing step 10 of a flow-chart of FIG. 1;

FIG. 12 is a plot illustrating data from simulations that utilize principles of the present invention;

FIGS. 13A, 13B, 13C, and 13D are plots illustrating data from simulations that utilize principles of the present invention;

FIGS. 14A and 14B are plots illustrating data from additional simulations that utilize principles of the present invention;

FIGS. 15A and 15B are plots illustrating data from further simulations that utilize principles of the present invention;

FIGS. 16A and 16B are plots illustrating data from yet additional simulations that utilize principles of the present invention;

FIGS. 17A and 17B are plots illustrating data from simulations that utilize principles of the present invention;

FIGS. 18A and 18B are plots illustrating data from further simulations that utilize principles of the present invention;

FIG. 19 is a plot illustrating data from additional simulations that utilize principles of the present invention;

FIGS. 20A, 20B, 20C, and 20D schematically illustrate characteristics of a photoresist pattern that can be produced by a modeling method according to the principles of a embodiment of the invention.

Exhibit A shows color images of FIGS. 1-20

DETAILED DESCRIPTION

As described above, the invention relates to a method of modeling an image intended to reside in a photoresist film on a substrate.

The method of modeling is preferably implemented on a general purpose computer and includes electronically compressing a simulated latent image in a predetermined direction in the production of a pattern that can be used either for transferring the pattern to a substrate, or for further modeling the pattern for transfer to the substrate. The method basically comprises electronically producing a simulated latent acid image of the image, compressing the simulated latent acid image in a predetermined direction, and developing the simulated latent acid image to a pattern that enables (a) transfer of the pattern to the substrate or (b) further modeling of the pattern for transfer to the substrate.

In a preferred version of the method of the present invention, the simulated latent acid image is electronically referenced to a set of x, y and z axes, and the predetermined direction comprises either of the z direction or along the optical axis related to imaging the substrate.

The method preferably includes an important sequence of steps where a development rate profile of the simulated latent acid image is produced, and then a final resist height is determined for the simulated latent acid image. Then, a critical dimension (CD) is determined from the final resist height, for the simulated latent acid image. Finally, a metrology offset is applied to the resist height, to complete development of the pattern. These aspects of the present invention are particularly useful where the image is a chemically amplified resist or an acid catalyzed resist, as will be apparent to those in the art.

In addition, a preferred embodiment of the method compressing the simulated latent image by electronically averaging the simulated latent acid image in the predetermined direction. The simulated latent acid image is electronically referenced to a set of x, y and z axes, or to an optical axis that is used in producing the image on the substrate, and the predetermined direction comprises the z direction or along the optical axis. Compressing the simulated latent image comprises electronically providing a weighted average for the simulated latent acid image along the z direction, where the bottom of the simulated latent image is weighted higher than the top part (which is close to the surface of the substrate).

Figure 20:
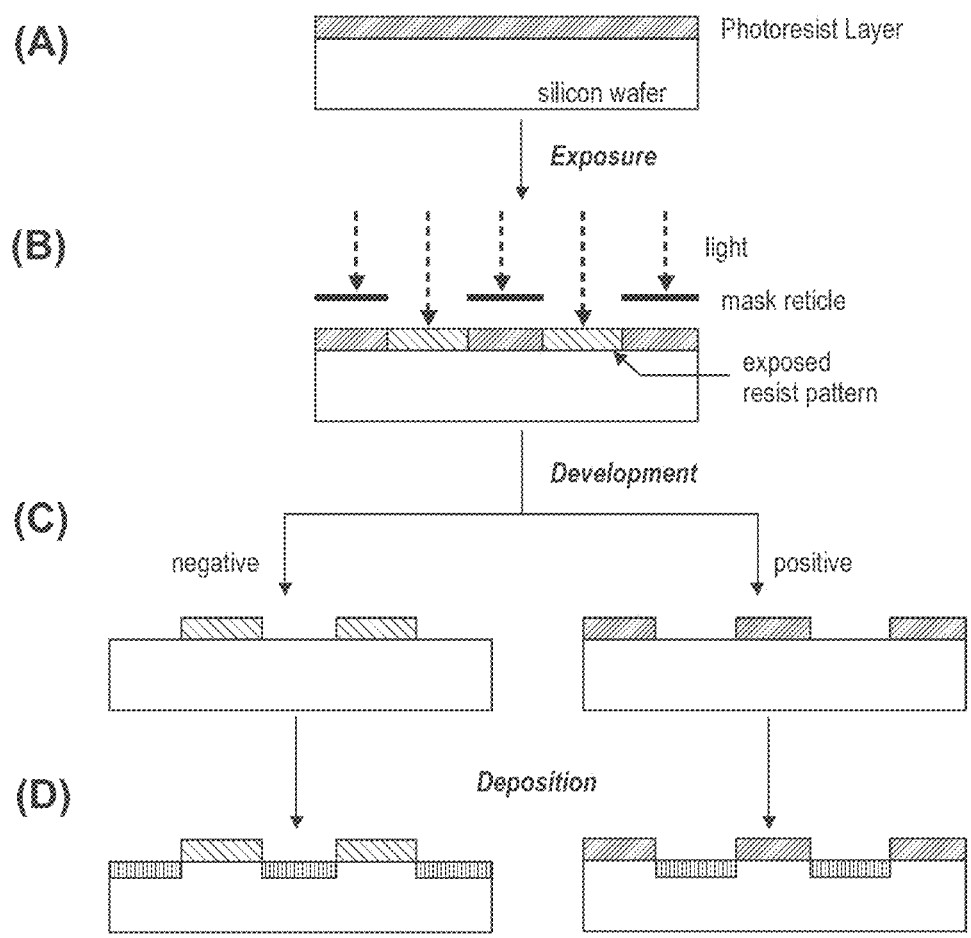

FIG. 1 is an Overview of a computer implemented Simulation Procedure, according to the principles of the present invention. FIGS. 2, 3A, 3B, 4A, 4B, 5A, 5B, 6, 7, 8A, 8B, 9A, 9B, 10A, 10B, and 11 show details of steps 1-10 of the method of FIG. 1. By practicing the modeling method of the present invention, a pattern is produced that can be transferred to the substrate, or subjected to further modeling before being transferred to the substrate. As schematically illustrated in FIG. 20, in producing an image on a substrate (e.g. a semi conductor silicon wafer) a photoresist material (the "photoresist layer") is applied to the substrate, and optically imaged (e.g. by a reticle or mask) to produce a pattern (referred to as a latent image) on the substrate. The imaged area is developed, in ways well known to those in the art, to produce the image on the substrate.

Figure 2:
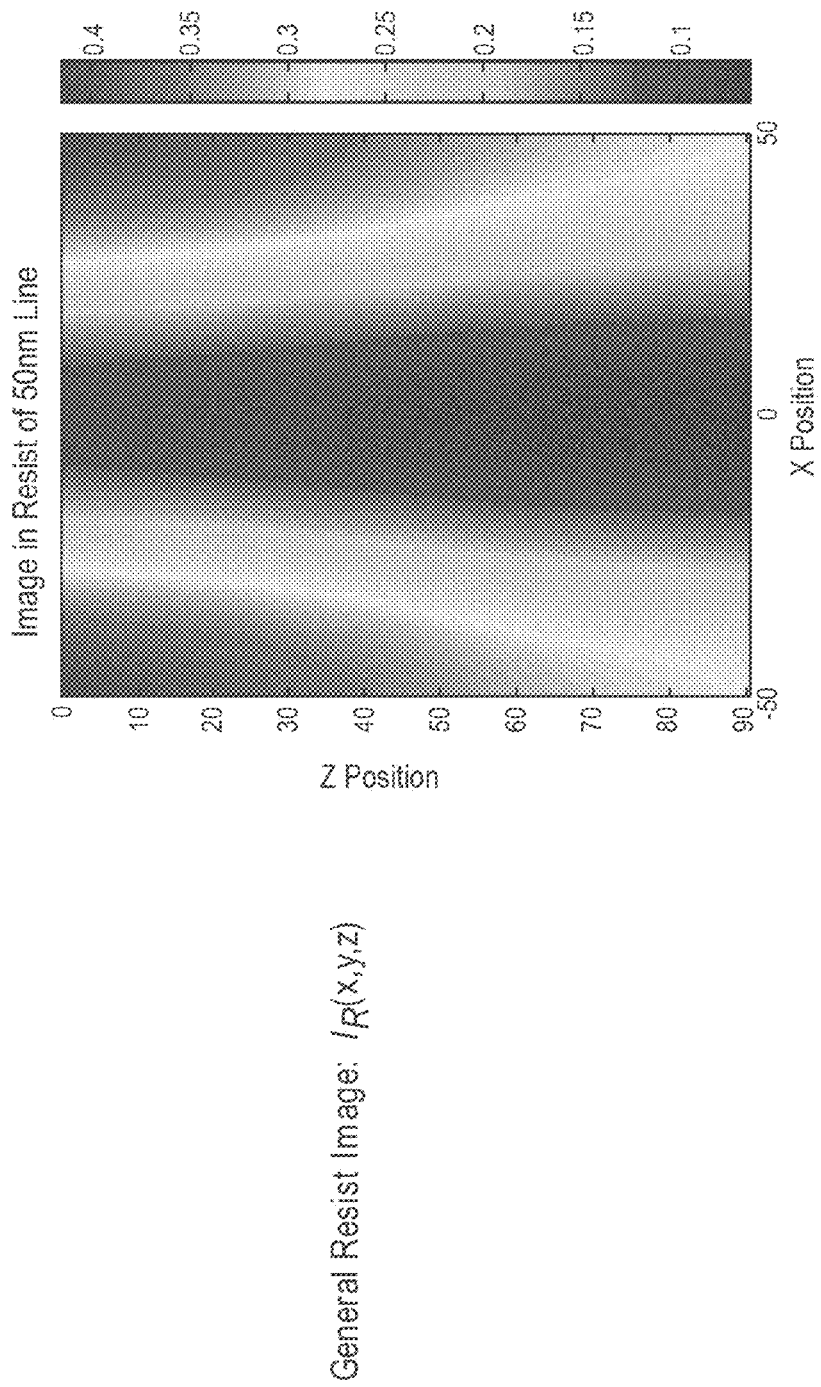
FIG. 2 is a general resist image illustrating a result of processing step 1 of a flow-chart of FIG. 1.

As shown by FIGS. 1 and 2, the first step in applicant's process of modeling an image intended to reside in a photoresist film on a substrate is to electronically determine (e.g. calculate) the image in a photoresist layer
  For every focus, calculate the image in photoresist layer, using a simulator program
    Focus=0 is defined at the top surface of the resist
  All thin film properties should be included such as refractive index and extinction coefficient
    $n_{resist}$, $k_{resist}$, Dill A$\cong$0 for ArF
  The image will be two dimensional (2D), described by the x-z axis, for a one dimensional (1D) feature, described by the x axis, such as a line or three dimensional (3D), described by the x-y-z axis, for a 2D feature, described by the x-y axis.

As shown by FIGS. 1 and 3A, 3B, the next step in applicant's process is to electronically determine (calculate) the simulated latent acid image (the latent image that will be developed by acid treatment of the photoresist layer). In that calculation, applicant notes that
  the image is electronically converted to a latent acid image by the following equation Acid Image: $I_A(x,y,z) = 1 - e^{-C \cdot Dose \cdot I_R(x,y,z)}$ Where C is the Dill C parameter in units of cm2/mJ and Dose is the exposure dose in units of mJ/cm2

Applicant Notes that C*Dose=normalized exposure dose, where 1 is the open frame exposure equivalent to the resist clearing dose As shown in FIGS. 1 and 4A, 4B, the next step in applicant's process is to electronically compress the simulated latent acid image. In applicant's preferred process, this involves
  electronically collapsing the simulated latent acid image from 2D/3D to 1D/2D
  electronically using a weighted average as a function of depth in film, to compress the simulated latent acid image, by the equation below
    weights are more linked to asymmetric properties of subsequent development steps
  Still captures all the film properties including defocus, spherical aberration, standing wave effects, etc. . . .
Weighted Average:

$$\bar{I}_A(x,y) = \frac{\sum_{i=0}^{d} W_i I_A(x,y;z_i)}{\sum_{i=0}^{d} W_i},$$

where $W_i = 1 + \gamma_w(z_i - z_p)$
  zp=pivot depth and gw is the weighting slope: Nominal values of 0 for both but can be tuned
    this is probably more important with thicker films
  Note: applicant has used an initial linear weighting for simplicity. An exponential can be used as well, but we need to understand the functionality and effects of weighting the average image.
  It should also be noted that in each of FIGS. 2, 3A, 3B, 4A, and 4B, the axes (x, y and z) to which the photoresist model is referenced are illustrated (in FIGS. 2, 3A, 3B, 4A, and 4B, the x and z axes are specifically shown, and the y axis would extend into and out of the x-z plane shown). In addition, it is noted that in FIGS. 2, 3A, 3B, 4A, and 4B, the optical axis of the photoresist model coincides with the z axis. Still further, FIGS. 4A and 4B also show the bottom of the latent resist image weighted higher than the top part (which is close to the surface of the substrate).

As shown in FIGS. 1 and 5A, 5B, the next step in applicant's process is to electronically model a quench of the simulated latent acid image with the initial base concentration, and electronically form the modified simulated latent acid image and quencher or base image concentrations
  There is an initial base concentration in photoresist that will quench the simulated latent acid image. The approximation described herein assumes instantaneous quenching.
    we end up with a modified acid concentration and a quencher or base "image" concentrations $\bar{I}'_A(x,y) = \text{Positive}\{\bar{I}_A(x,y) - Q\}$, where $Q$=normalized quenching concentration and $I'_A(x,y) \geq 0$ $\bar{I}'_A(x,y) = \text{Positive}\{Q - \bar{I}_A(x,y)\}$, where $Q$=normalized quenching concentration and $I'_Q(x,y) \geq 0$ As shown in FIGS. 1 and 6, the next step in applicant's process is to electronically simulate diffusion by post exposure bake (PEB) of the simulated latent acid image using convolution
  Assume that the acid and quencher images have separate diffusion lengths and possibly separate type of convolution kernels. Here, applicant has assumed Gaussian Kernels, but the literature also suggests double Gaussians or Lorentzian Kernels $$I_A''(x,y) = \beta_A (I_A'(x,y) \otimes K_A(x,y)) \text{ and } I_Q''(x,y) = (I_Q'(x,y) \otimes K_Q(x,y))$$

where $\beta_A$ and $\beta_Q$ are normalization constants to insure that $\Sigma I_A'(x,y) = \Sigma I_A''(x,y)$ and $\Sigma I_Q'(x,y) = \Sigma I_Q''(x,y)$ $$K_A(x,y) = e^{-\frac{x^2+y^2}{2\sigma_A^2}} \text{ and } K_Q(x,y) = \beta_Q e^{-\frac{x^2+y^2}{2\sigma_Q^2}},$$

where the diffusion lengths are defined by $\sigma_A$ and $\sigma_Q$

As shown by FIGS. 1 and 7, the next step in applicant's modeling process is electronic instantaneous quenching after PEB Similar to the process step of FIGS. 5A and 5B, we get instantaneous quenching. We create a final simulated latent acid image profile for subsequent development that is soluble. We ignore the base as it is assumed not to be affected by developer $$I_S(x,y) = \text{Positive}\{I_A''(x,y) - I_Q''(x,y)\}, \text{ where } I_S(x,y) \geq 0$$

As shown in FIGS. 1 and 8A, 8B, the next step in applicant's modeling process is to electronically create the inhibitor concentration To work with existing development models, we need to transform the soluble simulated latent acid image into an inhibitor image. This is a function that describes the "insolubility" of the image, m. m=1 is unexposed resist and does not develop, while m=0 is totally exposed resist This concentration occurs also during the PEB and has an amplification rate constant, $k_a$ (sometimes called $k_{amp}$ or $k1$)

Inhibitor Concentration Image: $m(x,y) = e^{-k_a \cdot t_{bake} \cdot I_S(x,y)}$,
where $t_{bake}$ is the PEB bake time (usually 60 sec) and $k_a$ is in units of sec$^{-1}$ As shown in FIGS. 1 and 9A, 9B, the next step in applicant's modeling process is to electronically create a development rate profile of the simulated latent acid image applicant uses a Mack development model to create the development rate, R(x,y) from the inhibitor concentration, m(x,y)

$$R(x,y) = R_{max} \frac{(a+1)(1-m(x,y))^n}{a+(1-m(x,y))^n} + R_{min}, \text{ where}$$

$$a = \frac{(n+1)}{(n-1)}(1-m_{th})^n$$

$R_{max}$ and $R_{min}$ are the maximum and minimum develop rates for fully exposed and unexposed resist. $m_{th}$ is a threshold inhibitor concentration term. n is called the development contrast or sensitivity of the developer. The Rates are in units of nm/sec As shown in FIGS. 1 and 10A, 10B, the next step in applicant's modeling process is to electronically create a developed thickness profile of the simulated latent acid image If we multiply our Rate, R(x,y), by the develop time, we get the nm of resist developed. Subtracting this from our initial undeveloped thickness gives the final resist height, H $$H_{dev} = H_{initial} - t_{dev} R(x,y), \text{ where } t_{dev} \text{ is the develop time in sec}$$

Note that we truncated the thickness at −10 nm.

As shown in FIGS. 1 and 11, the next step in applicant's process is to electronically determine (calculate) the linewidth or CD of the simulated latent acid image We calculate the line width at some thickness value; hence, Line width at $H(x,y) = h_0$ given by the position of the right and left edges at a height of $h_0$ Hence if the edges are given as $x_{right}(h_0) = x_r$ and $x_{left}(h_0) = x_l$,
the line width or CD is given as: $CD = \text{abs}(x_r - x_l)$ Common sense tells us that h0=0 should be the threshold height; however, there are many issues with line width metrology, model accuracy, and calibration that we should let h0 be a calibratable parameter As shown in FIG. 1, the final step in applicant's process is to electronically implement a metrology offset for the resist height.

There are often many issues comparing models from different simulators, experimental data measured with SEM, data measured with scatterometry.

Need to include one parameter called a "Metrology Offset" parameter, $M_0$ i.e., $$CD_{final}(x,y)_g = CD(x,y) - M_0$$

The modeling process described above produces (effectively transforms the simulated latent acid image into) a pattern (or stencil) that can be used in transferring an image to a photoresist layer, or which can be used as a development tool that can be further modeled by a developer to produce the pattern that cam be used in transferring an image to a photoresist layer.

It should be noted that the modeling sequence shown as steps 8-11 in FIGS. 1, 2, 3A, 3B, 4A, 4B, 5A, 5B, 6, 7, 8A, 8B, 9A, 9B, 10A, 10B, and 11 is considered by applicant to be important in the modeling method of the present invention. That sequence is particularly useful where the image is a chemically amplified resist or an acid catalyzed resist, as will be apparent to those in the art.

Also, it should be noted that reshaping the simulated latent acid image by modeling techniques as shown in steps 4-7 (i.e. quenching the simulated latent acid image, post exposure bake, post exposure acid-base reaction, and/or creation of inhibitor concentration from the simulated latent acid image) retains latent image development techniques (quenching, post exposure bake, acid-base diffusion determination of inhibitor concentration) that are well known to those in the art. In this regard, it should be further noted that a. After electronic conversion to acid the latent acid image is compressed by 1 dimension b. If we assume instantaneous chemical reactions we can simplify the PEB ("Post Exposure Bake") kinetics to a subtraction of quencher concentration profiles in combination with convolutions (known as a "Fukuda" approximation, which is a well known theory in the resist industry describing post exposure bake kinetics)

c. We can apply an electronic development model such as a "Mack" development tool (which is also well known in the resist industry) or any other development model to compute the inhibitor concentration d. We can create an electronic developed thickness profile and apply a threshold to extract a linewidth.

In addition, it should be noted that The invention provides new features that are believed to be particularly useful in modeling an image intended to reside in a photoresist film on a substrate: For example, a. Typical images in a photoresist film are either 2D (x transverse axis and z axial axis) or 3D (x,y,z). Subsequent modeling of the lithographic features consume a large amount of CPU and memory for such structures. The method of the present invention reduces the dimensionality of the problem by 1, after the image is converted to a latent acid image.

b. The method of the present invention reduces a large amount of CPU and memory that would otherwise be needed for modeling the image. The present invention reduces the dimensionality of the image, (by at least 1 dimension, after the image is converted to a latent acid image. Also, the method of the present invention adds the option of including a weighted average along the z direction. For example, the bottom of the latent resist image could be weighted higher than the top part (close to the surface of the substrate). This is necessary to counter balance any adverse effects of reducing the dimensionality of the image. The weighting is not limited to linear functions. For example it could be done with an exponential function.

c. In typical full resist models found in commercial software, the resist is electronically developed using small discreet time steps such that a development front is calculated in the x,y,z plane for each time step. This requires the computer to do extensive calculation and book keeping. The present invention produces the pattern by an electronic development rate profile that is not dependent on z; hence, the calculation time is almost instantaneous. Also, the use of the method described herein mitigates the adverse effects this approximation causes.

d. The method of the present invention effectively determines (calculates) photoresist line sizes (or x-y profiles) using a combination of an optical simulator to determine a pattern for the image, including a linewidth or CD ("Critical Dimension") of a one-dimensional (1D) reticle (mask) feature or a two-dimensional (2D) reticle feature.

e. Also, compressing the simulated latent image comprises electronically averaging the simulated latent acid image in the predetermined direction. The simulated latent acid image is electronically referenced to a set of x, y and z axes, or to an optical axis that is used in producing the image on the substrate, and the predetermined direction comprises the z direction or along the optical axis. Compressing the simulated latent image comprises electronically providing a weighted average for the simulated latent acid image along the z direction, where the bottom of the simulated latent image is weighted higher than the top part (which is close to the surface of the substrate).

FIGS. 12, 13A, 13B, 13C, 13D, 14A, 14B, 15A, 15B, 16A, 16B, 17A, 17B, 18A, 18B, and 19 show simulation data from a modeling process according to applicant's invention. Specifically, FIG. 12 shows a FEM ("Focus Exposure Matrices")_example Note the slight asymmetry in focus, this should be there due to a finite resist thickness
Starting Values can be as shown in the table below
Applicant's approach is to try these values first
Keep the Rmin, Rmax, mth fixed for now
zp and Gw can be set to 0 unless we need them

| Description | Symbol | Starting Values | Units |
|---|---|---|---|
| Image pivot depth | zp | 0.00000 | nm |
| Slope for Image weighting | Gw | 0.01000 | 1/nm |
| Dill C | C | 0.08130 | cm2/mJ |
| Relative Quencher Conc. | Q | 0.28740 | au |
| Amplification constant | ka | 0.08100 | 1/sec |
| Quencher Diffusion Length | Lq | 3.33260 | nm |
| Acid Diffusion Length | La | 14.31180 | nm |
| Development Contrast | n | 10.90400 | au |
| Inhibitor Threshold | mth | 0.47700 | au |
| Minimum Developmen Rate | Rmin | 0.00100 | nm/sec |
| Maximum Development Rate | Rmax | 1538.00000 | nm/sec |
| Metrology Threshold Height | h0 | 0.00000 | nm |
| Focus Offset | f0 | −0.04000 | microns |

Applicant's Calibration Method a. Calibration can be done on any mix of data such as FEMs, CD through Dose, CD through Pitch b. Best and most robust calibration seems to be using multiple FEMs
you need to look at multiple exposure and focus levels to get proper calibration
the isofocal dose level (as a function of CD and pitch) is an extremely important parameter to calibrate. This is highly sensitive to resist chemistry.

c. KLA-Tencor has been successful in using 4 FEMs to get robust calibration using a full resist model
this may not work with approximate models, as it may only find local optimization d. Probably need multiple 2-D structures, such as End-of-line, to calibrate approximate models
OPC models use 1500 structures with hundreds of 2D features
The "RoadRunner" model (described in Steps 1-11 above) designed to be more physical than OPC models.

FIGS. 13A, 13B, 13C, and 13D show Applicant's Experimental FEM Data, Full_resist_FEMs for Calibration.xls Applicant's Calibration Procedure 1. Rough calibration using dense line FEM, 50 nm Lines 100 nm Pitch
1 focus at focus=best focus and CD to <30% CD to start starting values
tune:
Dill's C, zp and Gw (and M0 if necessary)

2. Comprehensive tune with 1 FEMs
Tune: Dill's C, La, Q, Lq, ka, n
Fix: zp, Gw, mth, Rmax, Rmin, f0, M0

3. Comprehensive tune with 4 FEMs
all 4 FEMs
Restrict CD range to center of target 4. Comprehensive tune with 4 FEMs and End-of Line
Restrict EOL to focus=BF±25 nm and exposure=BE±3%

FIGS. 14A and 14B show applicant's simulation data for Quencher or Base
Fix focus at Best Focus and look at response through exposure Dose
50 nm dense line (solid lines)
70 nm isolated space (dashed lines)

FIGS. 15A and 15B show applicant's data for Acid Diffusion and Amplification
Fix focus at Best Focus and look at response through exposure Dose
50 nm dense line (solid lines)
70 nm isolated space (dashed lines)

FIGS. 16A and 16B show applicant's data for Development Contrast and mth
Fix focus at Best Focus and look at response through exposure Dose
50 nm dense line (solid lines)
70 nm isolated space (dashed lines)

FIGS. 17A and 17B show applicant's data for Development Rmax and Rmin
  Fix focus at Best Focus and look at response through exposure Dose
    50 nm dense line (solid lines)
    70 nm isolated space (dashed lines)
FIGS. 18A and 18B show applicant's data for Weighted Average Parameters for latent image
  Fix focus at Best Focus and look at response through exposure Dose
    50 nm dense line (solid lines)
    70 nm isolated space (dashed lines)
FIG. 19 shows applicant's data for Dill's C parameter: photospeed
  Fix focus at Best Focus and look at response through exposure Dose
    50 nm dense line (solid lines)
    70 nm isolated space (dashed lines)

Thus, as seen from the foregoing detailed description, the present invention provides a method of modeling an image intended to reside in a photoresist film on a substrate, by producing a simulated latent acid image of the image, compressing the simulated latent acid image in a predetermined direction, and developed the compressed simulated latent acid image to a pattern that enables (a) transfer of the pattern to the substrate or (b) further modeling of the pattern for transfer to the substrate. With the foregoing disclosure in mind, those in the art will recognize various ways of modeling an image intended to reside in a photoresist film on a substrate, using the principles of the present invention.

The invention claimed is:

1. A method for modeling a pattern intended to reside in a photoresist layer on a substrate, the method comprising:
  in a computer process, forming a stimulated latent acid image in the photoresist layer;
  reducing dimensions of the simulated latent acid image by one specified dimension to form a simulated latent acid image with reduced dimensions; and
  determining the pattern by calculating a time-dependent development rate profile of the simulated latent acid image in the photoresist layer;
  wherein the reducing dimensions includes removing dependency of the simulated latent acid image on said one specified dimension by weight-averaging of said simulated latent acid image such that a first portion of the simulated latent image located farther away from a top of the photoresist layer is weighted higher than a second portion of the simulated latent image located closer to said top.

2. A method according to claim 1, further comprising modifying the stimulated latent acid image with reduced dimensions to an inhibitor concentration image associated with insolubility of the photoresist layer.

3. A method according to claim 1, further comprising calculating a post-exposure bake (PEB) simulated latent acid image with reduced dimensions by
  a) calculating changes in the simulated latent acid image with reduced dimensions due to first quenching with base initially contained in the photoresist layer, said quenching performed prior to a PEB process; and
  b) modifying an image resulting from said changes by calculating transformations of the photoresist layer during the PEB process based on a convolution.

4. A method according to claim 3, further comprising reshaping said PEB simulated latent acid image with reduced dimensions by calculating second quenching process that follows the PEB process.

5. A method according to claim 1, wherein said determining the pattern includes calculating a time-dependent development rate profile based at least on development rates of fully exposed photoresist and unexposed photoresist and a threshold inhibitor concentration.

6. A method according to claim 1, further comprising determining a geometrical extent of the pattern along the one specified dimension from the development rate profile.

7. A method according to claim 1, wherein the one specified dimension includes a longitudinal dimension corresponding to an optical axis associated with exposure of the photoresist layer, and wherein the weight-averaging of said simulated latent acid image is effectuated according to $\bar{I}_A(x,y)=\Sigma_{i=0}^{d}W_i I_A(x,y,z)/\Sigma_{i=1}^{d}W_i$, wherein $I_A$ represents the simulated latent acid image, $\bar{I}_A$ represents a weight-averaged simulated latent acid image with reduced dimensions, and $W_i$ is a weight factor dependent on a distance along the longitudinal dimension, a pivot depth parameter, and a weighting slope parameter.

8. A method according to claim 1, further comprising determining a linewidth parameter associated with the pattern in a plane of the photoresist layer, said linewidth parameter including an experimentally determined correction factor.

9. A method according to claim 1, further comprising calculating the stimulated latent acid image in a computer process based at least on a complex refractive index of the photoresist layer and a photoresist clearing exposure dose.

10. A method according to claim 1, wherein the determining includes determining said pattern by calculating said time-dependent development rate profile, said development rate profile being independent from a parameter representing a distance measured along the one specified dimension.

11. A method for modeling a pattern intended to reside in a photoresist layer on a substrate as a result of a photolithography process, the method comprising:
  in a computer process, forming a stimulated latent acid image associated with the photoresist layer;
  reducing dimensions of the simulated latent acid image by one dimension to form a simulated latent acid image with reduced dimensions by removing a dependency of said simulated latent acid image on a parameter representing a distance along an optical axis associated with the photolithography process,
    wherein the stimulated latent acid image has been calculated based at least on a complex refractive index of the photoresist layer and a photoresist clearing exposure dose;
  modifying the stimulated latent acid image with reduced dimensions to an inhibitor concentration image associated with insolubility of the photoresist layer; and
  determining the pattern by calculating a time-dependent development rate profile of the simulated latent acid image in the photoresist layer, said development rate profile being independent from said parameter.

12. A method according to claim 11, further comprising reshaping the simulated latent acid image with reduced dimensions in a computer process by at least one of
  modeling a first quenching of said image with base initially contained in the photoresist layer prior to a PEB process;
  modeling the PEB process; and
  modeling a second quenching of said image post-PEB process.

13. A method according to claim 11, wherein said determining the pattern includes calculating a time-dependent development rate profile based at least on a development rate of fully exposed photoresist, a development rate of unexposed photoresist, and on a threshold inhibitor concentration.

14. A method according to claim 11, further comprising determining a geometrical extent of the pattern along said one dimension from the development rate profile.

15. A method according to claim 11, wherein the reducing dimensions includes removing dependency of the simulated latent acid image on said one dimension by weight-averaging of said simulated latent acid image such that a first portion of the simulated latent image located farther away from a top of the photoresist layer is weighted higher than a second portion of the simulated latent image located closer to said top.

16. A method according to claim 15, wherein said one dimension includes a longitudinal dimension corresponding to an optical axis associated with exposure of the photoresist layer, and wherein the weight-averaging of said simulated latent acid image is effectuated according to $\bar{I}_A(x,y) = \sum_{i=0}^{d} W_i I_A(x,y,z) / \sum_{i=1}^{d} W_i$, wherein $I_A$ represents the simulated latent acid image, $\bar{I}_A$ represents a weight-averaged simulated latent acid image with reduced dimensions, and $W_i$ is a weight factor dependent on a distance along the longitudinal dimension, a pivot depth parameter, and a weighting slope parameter.

17. A method according to claim 11, further comprising determining a linewidth parameter associated with the pattern in a plane of the photoresist layer, said linewidth parameter including an experimentally determined correction factor.

18. A method for modeling a pattern intended to reside in a photoresist layer on a substrate, the method comprising:
in a computer process, forming a stimulated latent acid image in the photoresist layer;
reducing dimensions of the simulated latent acid image by one specified dimension to form a simulated latent acid image with reduced dimensions;
modifying the stimulated latent acid image with reduced dimensions to an inhibitor concentration image associated with insolubility of the photoresist layer; and
determining the pattern by calculating a time-dependent development rate profile of the simulated latent acid image in the photoresist layer, said development rate profile being independent from a parameter representing a distance measured along the one specified dimension.

19. A method according to claim 18, wherein said determining the pattern includes calculating a time-dependent development rate profile based at least on a development rate of fully exposed photoresist, a development rate of unexposed photoresist, and a threshold inhibitor concentration.

20. A method for modeling a pattern intended to reside in a photoresist layer on a substrate, the method comprising:
in a computer process, forming a stimulated latent acid image in the photoresist layer;
reducing dimensions of the simulated latent acid image by one specified dimension to form a simulated latent acid image with reduced dimensions;
determining the pattern by calculating a time-dependent development rate profile of the simulated latent acid image in the photoresist layer; and
modifying the stimulated latent acid image with reduced dimensions to an inhibitor concentration image associated with insolubility of the photoresist layer.

21. A method for modeling a pattern intended to reside in a photoresist layer on a substrate, the method comprising:
in a computer process, forming a stimulated latent acid image in the photoresist layer;
reducing dimensions of the simulated latent acid image by one specified dimension to form a simulated latent acid image with reduced dimensions;
determining the pattern by calculating a time-dependent development rate profile of the simulated latent acid image in the photoresist layer;
wherein said determining the pattern includes calculating a time-dependent development rate profile based at least on a development rate of fully exposed photoresist, a development rate of unexposed photoresist, and a threshold inhibitor concentration.

22. A method for modeling a pattern intended to reside in a photoresist layer on a substrate, the method comprising:
in a computer process, forming a stimulated latent acid image in the photoresist layer;
reducing dimensions of the simulated latent acid image by one specified dimension to form a simulated latent acid image with reduced dimensions;
determining the pattern by calculating a time-dependent development rate profile of the simulated latent acid image in the photoresist layer; and
determining a geometrical extent of the pattern along the one specified dimension from the development rate profile.

23. A method for modeling a pattern intended to reside in a photoresist layer on a substrate, the method comprising:
in a computer process, forming a stimulated latent acid image in the photoresist layer;
reducing dimensions of the simulated latent acid image by one specified dimension to form a simulated latent acid image with reduced dimensions;
determining the pattern by calculating a time-dependent development rate profile of the simulated latent acid image in the photoresist layer; and
calculating the stimulated latent acid image in a computer process based at least on a complex refractive index of the photoresist layer and a photoresist clearing exposure dose.

24. A method for modeling a pattern intended to reside in a photoresist layer on a substrate, the method comprising:
in a computer process, forming a stimulated latent acid image in the photoresist layer;
reducing dimensions of the simulated latent acid image by one specified dimension to form a simulated latent acid image with reduced dimensions;
determining the pattern by calculating a time-dependent development rate profile of the simulated latent acid image in the photoresist layer;
wherein the determining includes determining said pattern by calculating said time-dependent development rate profile, said development rate profile being independent from a parameter representing a distance measured along the one specified dimension.

* * * * *